United States Patent
Torii et al.

(10) Patent No.: US 11,221,231 B2
(45) Date of Patent: Jan. 11, 2022

(54) ENCODER

(71) Applicant: Mitsubishi Electric Corporation, Tokyo (JP)

(72) Inventors: Hisanori Torii, Tokyo (JP); Takuya Noguchi, Tokyo (JP); Daisuke Kanamori, Tokyo (JP); Takeshi Musha, Tokyo (JP); Fumiaki Tsuchiya, Tokyo (JP); Yasuhiro Kitayama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/051,445

(22) PCT Filed: May 23, 2018

(86) PCT No.: PCT/JP2018/019901
§ 371 (c)(1),
(2) Date: Oct. 29, 2020

(87) PCT Pub. No.: WO2019/224962
PCT Pub. Date: Nov. 28, 2019

(65) Prior Publication Data
US 2021/0231462 A1 Jul. 29, 2021

(51) Int. Cl.
*G01D 3/028* (2006.01)
*G01D 5/14* (2006.01)
(Continued)

(52) U.S. Cl.
CPC .............. *G01D 3/028* (2013.01); *G01D 5/14* (2013.01); *H01F 7/02* (2013.01); *H05K 9/0075* (2013.01)

(58) Field of Classification Search
CPC . G01D 3/028; G01D 5/14; H01F 7/02; H05K 9/0075
See application file for complete search history.

(56) References Cited

U.S. PATENT DOCUMENTS

| 8,471,553 B2 | 6/2013 | Tategami |
| 2006/0039639 A1* | 2/2006 | Aoki ...................... G01P 3/487 |
| | | 384/448 |

(Continued)

FOREIGN PATENT DOCUMENTS

| CN | 101029836 A | 9/2007 |
| CN | 101584116 A | 11/2009 |

(Continued)

OTHER PUBLICATIONS

International Search Report and Written Opinion dated Aug. 28, 2018 for PCT/JP2018/019901 filed on May 23, 2018, 11 pages including English Translation of the International Search Report.

(Continued)

*Primary Examiner* — Huy Q Phan
*Assistant Examiner* — Adam S Clarke
(74) *Attorney, Agent, or Firm* — Xsensus LLP (57) ABSTRACT

An encoder includes a magnetic sensor having higher detection sensitivity to a magnetic field applied in a reading direction, while having lower detection sensitivity to a magnetic field applied in a direction forming a greater angle with respect to the reading direction, an encoder substrate having the magnetic sensor mounted thereon, a magnetic shield to shield against a magnetic field including a side portion covering sides of the magnetic sensor and a top-side portion covering a top of the magnetic sensor, a permanent magnet located to face the encoder substrate, a shaft having the permanent magnet attached to a tip end of the shaft, and a bracket to support the shaft in a rotatable manner, wherein on the side portion of the magnetic shield, a notch as a connector insertion portion is located not to overlap an extended area of the magnetic sensor in the reading direction.

16 Claims, 5 Drawing Sheets

(51) Int. Cl.
*H01F 7/02* (2006.01)
*H05K 9/00* (2006.01)

(56) References Cited

U.S. PATENT DOCUMENTS

| | | | |
|---|---|---|---|
| 2008/0164867 A1 | 7/2008 | Steinich et al. | |
| 2009/0072816 A1 | 3/2009 | Schrubbe et al. | |
| 2011/0192087 A1 | 8/2011 | Tategami | |
| 2012/0006982 A1* | 1/2012 | Satone | G01D 5/34738 250/231.1 |
| 2014/0084908 A1* | 3/2014 | Kaiser | G01D 11/245 324/207.25 |
| 2015/0253155 A1 | 9/2015 | Makiuchi et al. | |
| 2016/0025516 A1* | 1/2016 | Asano | G01D 5/16 324/207.21 |

FOREIGN PATENT DOCUMENTS

| | | |
|---|---|---|
| DE | 102007018758 A1 | 7/2008 |
| JP | 63-70265 U | 5/1988 |
| JP | 11-23213 A | 1/1999 |
| JP | H11-23213 A | 1/1999 |
| JP | 2003-14407 A | 1/2003 |
| JP | 2006-47159 A | 2/2006 |
| JP | 2009-147778 A | 7/2009 |
| JP | 2015-169439 A | 9/2015 |
| WO | 2016/021073 A1 | 2/2016 |
| WO | 2017/017806 A1 | 2/2017 |

OTHER PUBLICATIONS

Office Action received for Japanese Patent Application No. 2018-563744, dated Jan. 22, 2019, 10 pages including English Translation.
Decision to Grant a Patent received for Japanese Patent Application No. 2018-563744, dated Apr. 16, 2019, 5 pages including English Translation.
Office Action dated Mar. 29, 2021, in corresponding Korean patent Application No. 10-2020-7032712, 10 pages.
Office Action dated Jul. 22, 2021, in corresponding German patent Application No. 112018007488.9, 13 pages.
Office Action dated May 7, 2021, in corresponding Chinese patent Application No. 201880093569.3, 18 pages.
Indian Office Action dated Sep. 9, 2021, in corresponding Indian Patent Application No. 202027045519.
Chinese Office Action dated Sep. 17, 2021, in corresponding Chinese Patent Application No. 201880093569.3.

* cited by examiner

ENCODER

CROSS-REFERENCE TO RELATED APPLICATIONS

The present application is based on PCT filing PCT/JP2018/019901, filed May 23, 2018, the entire contents of which are incorporated herein by reference.

FIELD

The present invention relates to an encoder including a magnetic shield and a magnetic sensor.

BACKGROUND

In a magnetic encoder with a magnetic sensor mounted on a substrate, a permanent magnet is located on a shaft about its axial center, and generates a magnetic flux to operate the magnetic sensor. The magnetic sensor detects a magnetic flux generated from the permanent magnet. However, when there is a device or a power line generating a magnetic field around the encoder, this leads to a problem in that an external magnetic field interferes with a magnetic flux generated from the permanent magnet, which causes the magnetic sensor to operate improperly. Therefore, it is necessary to place a magnetic shield to shield the magnetic sensor from the external magnetic field.

Patent Literature 1 discloses a magnetic encoder in which a magnetic cover is placed in such a manner that a soft magnetic portion is located at a position where the soft magnetic portion does not affect the operating magnetic field of a magnetic sensor.

CITATION LIST

Patent Literature

Patent Literature 1: Japanese Patent Application Laid-open No. 2015-169439

SUMMARY

Technical Problem

However, in the structure of the encoder disclosed in Patent Literature 1, an external magnetic field, applied in a direction that is the same as the detection direction in which the magnetic sensor detects a magnetic flux generated from the permanent magnet, may possibly enter the magnetic cover through a non-magnetic portion. Therefore, there is a problem in that an external magnetic field applied in a direction that is the same as the detection direction of the magnetic sensor may enter the magnetic cover through the non-magnetic portion, which increases a noise component of the detection result of the magnetic sensor and accordingly decreases accuracy in detecting the rotational angle.

The present invention has been achieved to solve the above problems, and an object of the present invention is to provide an encoder that prevents or reduces a decrease in accuracy in detecting a rotational angle caused by an external magnetic field.

Solution to Problem

The present invention according to an aspect thereof includes: a magnetic sensor having directional detection sensitivity to a magnetic field, the magnetic sensor having higher detection sensitivity to a magnetic field applied in a reading direction, while having lower detection sensitivity to a magnetic field applied in a direction forming a greater angle with respect to the reading direction; an encoder substrate having the magnetic sensor mounted thereon; a magnetic shield to shield against a magnetic field, the magnetic shield including a side portion covering sides of the magnetic sensor and a top-side portion covering a top of the magnetic sensor; a permanent magnet located to face the encoder substrate; a shaft having the permanent magnet attached to a tip end of the shaft; and a bracket to support the shaft in a rotatable manner. On the side portion of the magnetic shield, a notch or a hole is provided to serve as a connector insertion portion through which a connector is inserted. The connector insertion portion is located at a position where the connector insertion portion does not overlap an extended area that is obtained by extending the magnetic sensor in the reading direction.

Advantageous Effects of Invention

The encoder according to the present invention has an effect where it is possible to prevent or reduce a decrease in accuracy in detecting a rotational angle caused by an external magnetic field.

DESCRIPTION OF EMBODIMENTS

An encoder according to embodiments of the present invention will be described in detail below with reference to the accompanying drawings. The present invention is not limited to the embodiments.

First Embodiment

Figure 1:
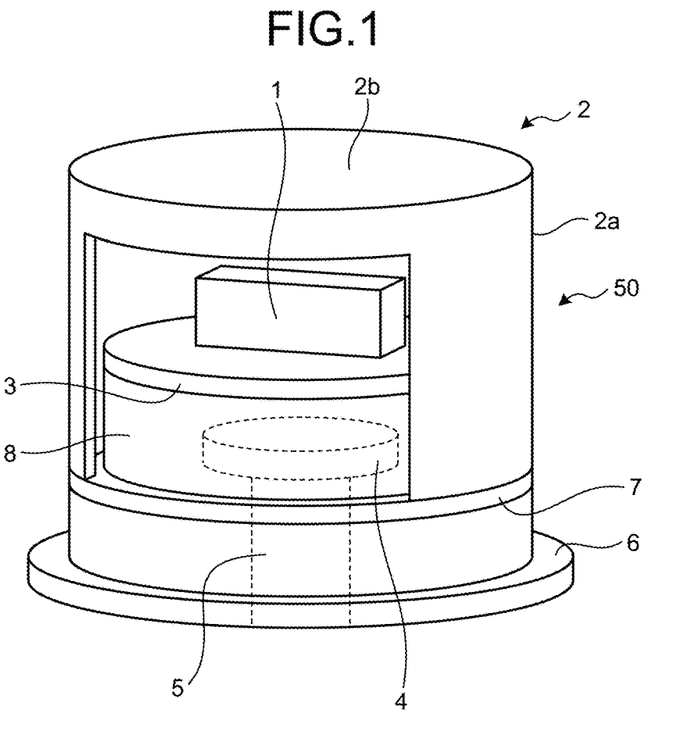
FIG. 1 is a perspective view of an encoder according to a first embodiment of the present invention.

FIG. 1 is a perspective view of an encoder according to a first embodiment of the present invention. An encoder 50 according to the first embodiment includes a permanent magnet 4 that rotates along with a shaft 5, a magnetic sensor 1 having directional detection sensitivity to a magnetic field, the magnetic sensor 1 having higher detection sensitivity to a magnetic field applied in a reading direction, while having lower detection sensitivity to a magnetic field applied in a direction forming a greater angle with respect to the reading direction, an encoder substrate 3 having the magnetic sensor 1 mounted thereon, a bracket 6 formed of non-magnetic material to support the shaft 5 in a rotatable manner, a magnetic shield 2 to cover the encoder substrate 3, a spacer 7 located between the bracket 6 and the magnetic shield 2, and a substrate holding member 8 placed on the bracket 6 to support the encoder substrate 3. While the spacer 7 illustrated in FIG. 1 has a ring shape and is interposed only between the bracket 6 and the magnetic shield 2, it is allowable that the spacer 7 has a dome shape covering the encoder substrate 3.

Figure 2:
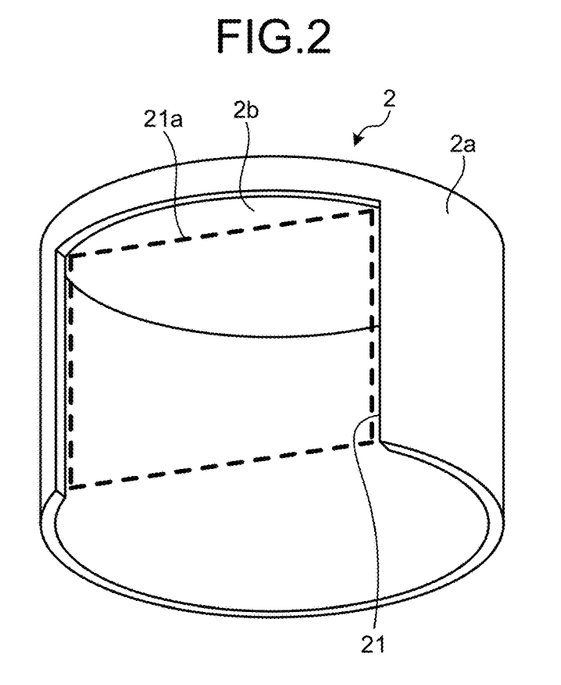
FIG. 2 is a perspective view of a magnetic shield of the encoder according to the first embodiment.

FIG. 2 is a perspective view of the magnetic shield of the encoder according to the first embodiment. The magnetic shield 2 includes a side portion 2a covering the sides of the magnetic sensor 1 and a top-side portion 2b covering the top of the magnetic sensor 1. On the side of the magnetic shield 2, a notch 21 is formed to serve as a connector insertion portion through which a connector is inserted to be connected to the encoder substrate 3. It is allowable that a hole is formed on the side of the magnetic shield 2 to serve as the connector insertion portion. The magnetic shield 2 is formed of magnetic material such as cold-rolled steel or carbon steel.

The permanent magnet 4 is located such that the permanent magnet 4 and the encoder substrate 3 face each other. The permanent magnet 4 is placed at the tip end of the shaft 5. The permanent magnet 4 is a magnet of neodymium series, samarium series, or ferrite series. It is allowable that the permanent magnet 4 is fixed directly to the shaft 5 or is fixed to the shaft 5 through a member (not unillustrated).

Figure 3:
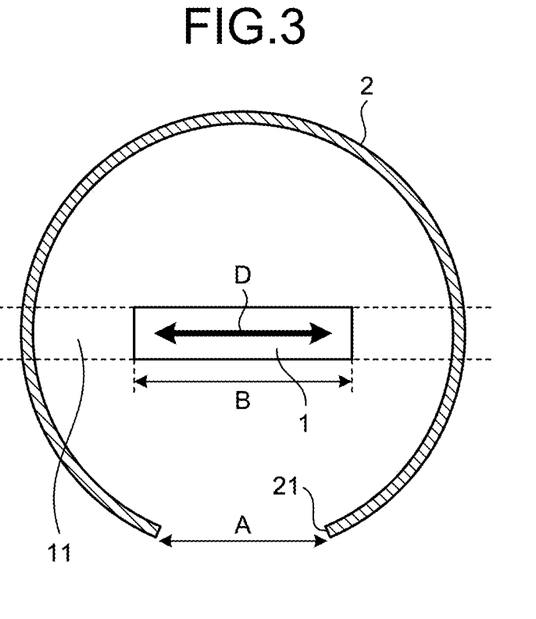
FIG. 3 is a diagram illustrating a positional relation between a magnetic sensor and the magnetic shield of the encoder according to the first embodiment.

FIG. 3 is a diagram illustrating a positional relation between the magnetic sensor and the magnetic shield of the encoder according to the first embodiment. The magnetic sensor 1 has directional detection sensitivity to a magnetic field. The magnetic sensor 1 has higher detection sensitivity to a magnetic field applied in a direction illustrated by an arrow D in FIG. 3, while having lower detection sensitivity to a magnetic field applied in a direction closer to the direction perpendicular to the arrow D. Hereinafter, the direction illustrated by the arrow D is referred to as "the reading direction of the magnetic sensor 1". The magnetic shield 2 covers the magnetic sensor 1 in a state in which the notch 21 is located at a position where the notch 21 does not overlap an extended area 11 that is obtained by extending the magnetic sensor 1 in the reading direction. In a case where an external magnetic field is applied from a direction where the notch 21 is located, a magnetic flux enters the magnetic shield 2 from the notch 21. However, the direction of the magnetic flux is perpendicular to the reading direction of the magnetic sensor 1, and accordingly the magnetic sensor 1 has lower detection sensitivity to the external magnetic field. This results in a smaller noise component. Further, in a case where an external magnetic field is applied from the reading direction of the magnetic sensor 1, because the magnetic shield 2 covers the location that overlaps the extended area 11, this reduces or prevents the external magnetic field from entering the magnetic shield 2. Therefore, although the magnetic shield 2 is formed with the notch 21, when an external magnetic field is applied from a radial direction of the shaft 5, a noise component included in the detection result of magnetic field detected by the magnetic sensor 1 can be reduced.

Because the spacer 7 is interposed between the bracket 6 and the magnetic shield 2, the bracket 6 and the magnetic shield 2 are not in direct contact with each other, but are held spaced apart from each other by the thickness of the spacer 7. The spacer 7 is interposed between the bracket 6 and the magnetic shield 2, and thereby the bracket 6 and the magnetic shield 2 are thermally separated from each other. Providing a thermal gap between the bracket 6 and the magnetic shield 2 can prevent or reduce thermal transmission from the shaft 5 during driving of a motor that rotates the shaft 5. Particularly, a distance between the bracket 6 and the magnetic shield 2 is set equal to or shorter than 5 mm. This setting can prevent a magnetic flux from entering the inner side of the magnetic shield 2, and thus can reduce a noise component included in the detection result of magnetic field detected by the magnetic sensor 1.

An opening width A of the notch 21 of the magnetic shield 2 is made smaller than a dimension B of the magnetic sensor 1 in the reading direction. This configuration can prevent a magnetic flux from entering the inner side of the magnetic shield 2, and thus can enhance the effect of reducing a noise component included in the detection result of magnetic field detected by the magnetic sensor 1.

Figure 4:
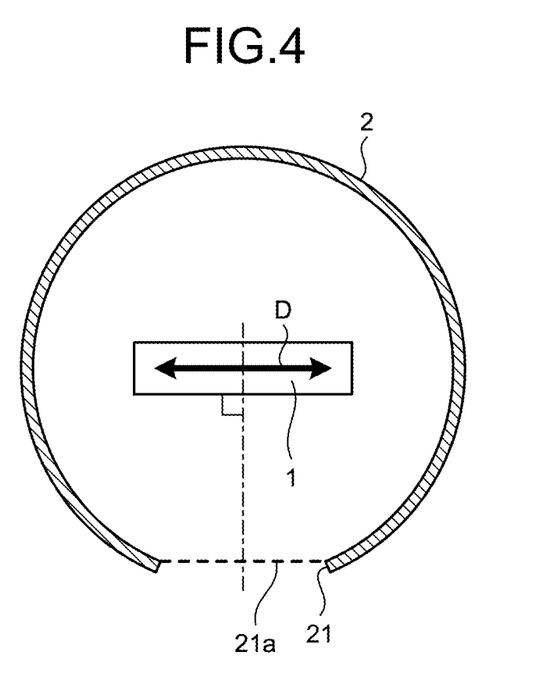
FIG. 4 is a diagram illustrating a positional relation between the magnetic sensor and the magnetic shield of the encoder according to the first embodiment.

FIG. 4 is a diagram illustrating a positional relation between the magnetic sensor and the magnetic shield of the encoder according to the first embodiment. As illustrated in FIG. 4, the magnetic shield 2 is located in such a manner that the direction of the normal to an opening plane 21a of the notch 21 of the magnetic shield 2 is perpendicular to the reading direction of the magnetic sensor 1. This can further reduce a noise component included in the detection result of magnetic field detected by the magnetic sensor 1 when an external magnetic field is applied.

As illustrated in FIG. 2, the notch 21 does not reach the top-side portion 2b of the magnetic shield 2. This can also reduce a noise component included in the detection result of magnetic field detected by the magnetic sensor 1, even when an external magnetic field in the axial direction of the shaft 5 is applied to the encoder 50.

Even when the magnetic shield 2 is provided with the notch 21 serving as the connector insertion portion, the encoder 50 according to the first embodiment can still reduce a noise component included in the detection result of magnetic field detected by the magnetic sensor 1 when an external magnetic field is applied. In a case where the encoder 50 according to the first embodiment is applied with an external magnetic field from a direction crossing the opening plane 21a of the notch 21, a magnetic flux enters the magnetic shield 2 through the notch 21. However, due to the magnetic flux in a direction crossing the reading direction of the magnetic sensor 1, a smaller noise component is included in the detection result of magnetic field detected by the magnetic sensor 1. Further, in a case where the encoder 50 according to the first embodiment is applied with an external magnetic field from the reading direction of the magnetic sensor 1, because the notch 21 is located at a position where the notch 21 does not overlap the extended area 11, this can reduce a noise component included in the detection result of magnetic field detected by the magnetic sensor 1. Therefore, the encoder 50 according to the first embodiment is highly resistant to an external magnetic field, and can increase accuracy in detecting the rotational angle of the shaft 5. Furthermore, the encoder 50 does not need to be covered in its entirety including the connector with the magnetic shield 2, and thus it is possible to downsize the encoder 50.

Second Embodiment

Figure 5:
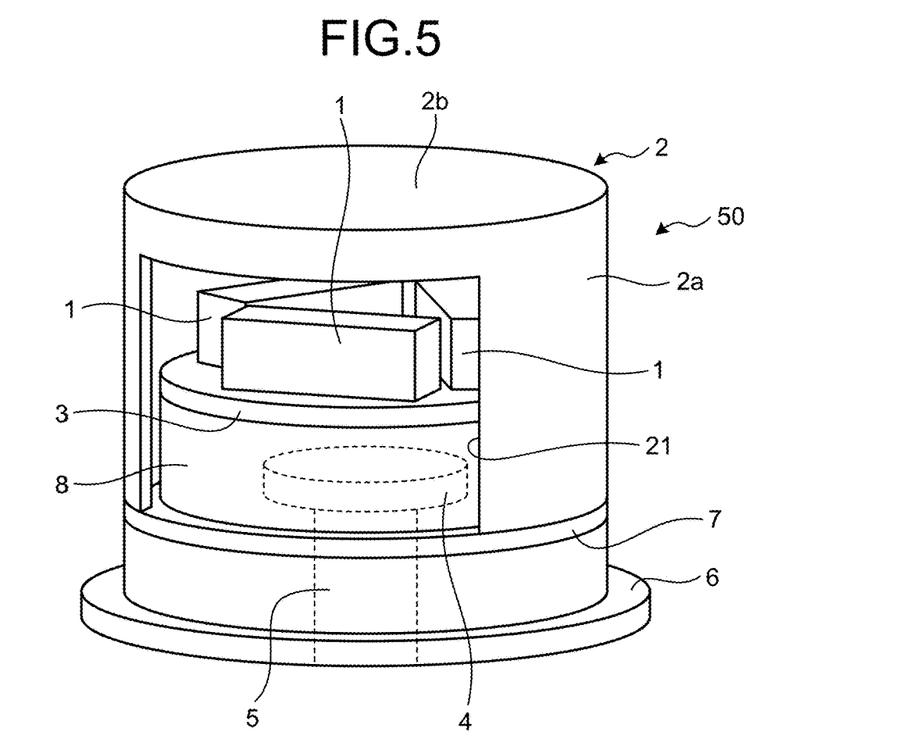
FIG. 5 is a perspective view of an encoder according to a second embodiment of the present invention.

FIG. 5 is a perspective view of an encoder according to a second embodiment of the present invention. The encoder 50 according to the second embodiment is different from the encoder 50 according to the first embodiment in that a plurality of magnetic sensors 1 are mounted on the encoder substrate 3.

Figure 6:
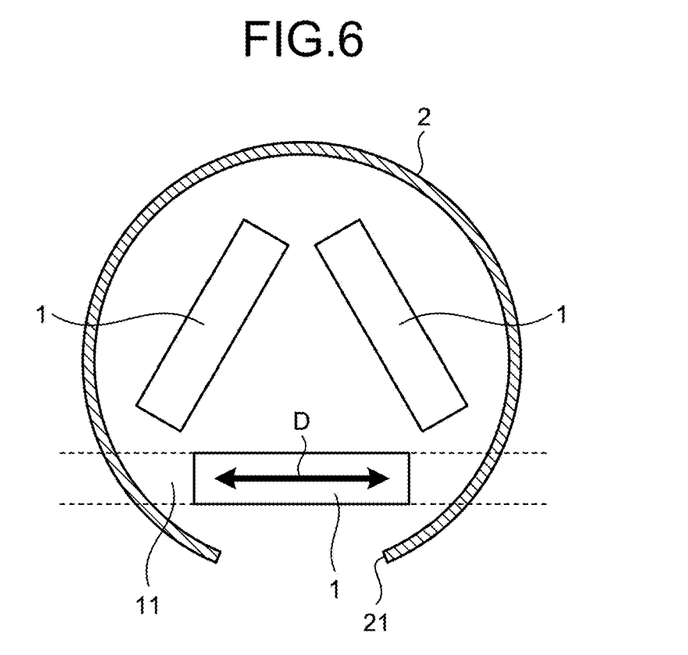
FIG. 6 is a diagram illustrating a positional relation between magnetic sensors and a magnetic shield of the encoder according to the second embodiment.

FIG. 6 is a diagram illustrating a positional relation between the magnetic sensors and the magnetic shield of the encoder according to the second embodiment. As illustrated in FIG. 6, the magnetic shield 2 covers the location that overlaps the extended area 11 of one of the magnetic sensors 1 which is positioned nearest the notch 21.

Figure 7:
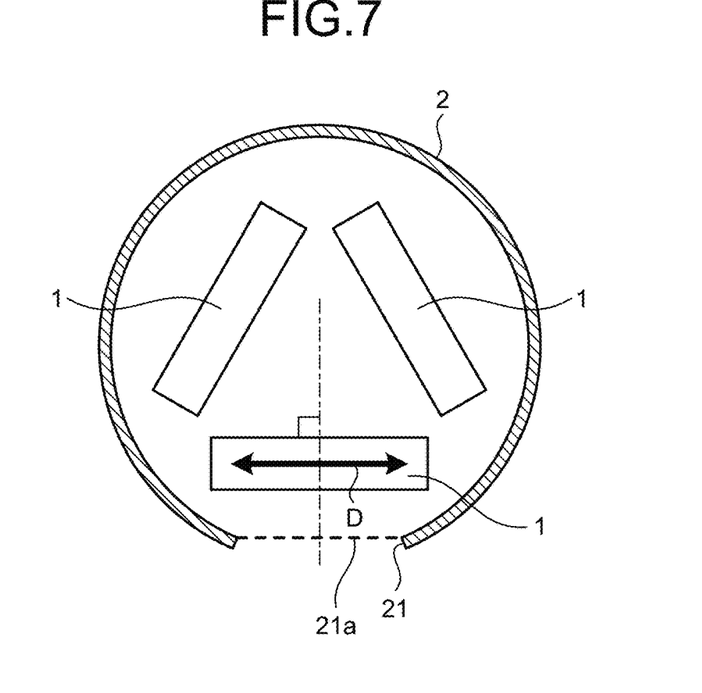
FIG. 7 is a diagram illustrating a positional relation between the magnetic sensors and the magnetic shield of the encoder according to the second embodiment.

FIG. 7 is a diagram illustrating a positional relation between the magnetic sensors and the magnetic shield of the encoder according to the second embodiment. As illustrated in FIG. 7, the magnetic shield 2 is located in such a manner that the direction of the normal to the opening plane 21a of the notch 21 of the magnetic shield 2 is perpendicular to the reading direction of the magnetic sensor 1. This can further reduce a noise component included in the detection result of magnetic field detected by the magnetic sensor 1 when an external magnetic field is applied.

Figure 8:
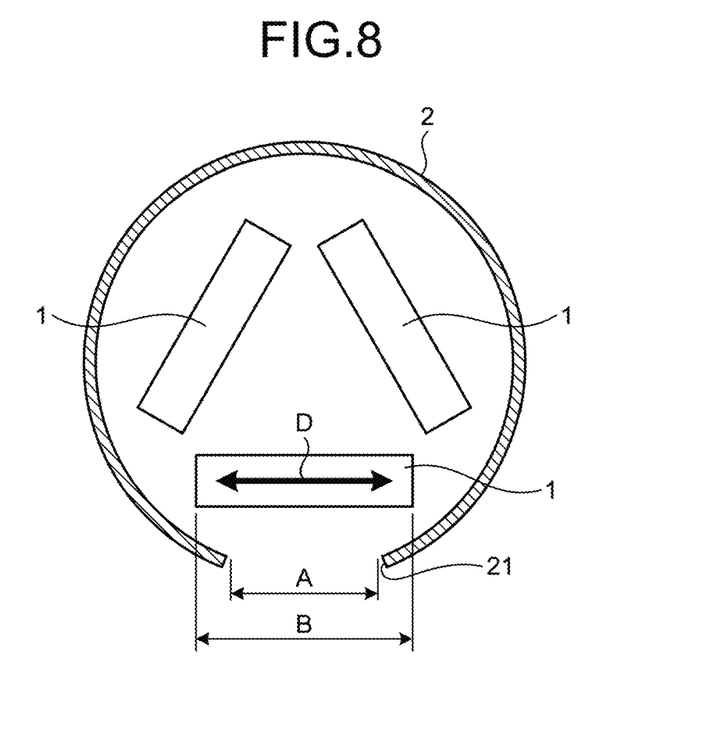
FIG. 8 is a diagram illustrating a positional relation between the magnetic sensors and the magnetic shield of the encoder according to the second embodiment.

FIG. 8 is a diagram illustrating a positional relation between the magnetic sensors and the magnetic shield of the encoder according to the second embodiment. The opening width A of the notch 21 of the magnetic shield 2 is made smaller than the dimension B of the magnetic sensor 1 in the reading direction. This configuration can prevent a magnetic flux from entering the inner side of the magnetic shield 2, and thus can enhance the effect of reducing a noise component included in the detection result of magnetic field detected by the magnetic sensor 1.

The encoder 50 according to the second embodiment has the magnetic sensors 1 mounted on the encoder substrate 3, thereby reducing or preventing failure to detect a magnetic field. Therefore, it is possible for the encoder 50 to ensure its functional safety.

Third Embodiment

Figure 9:
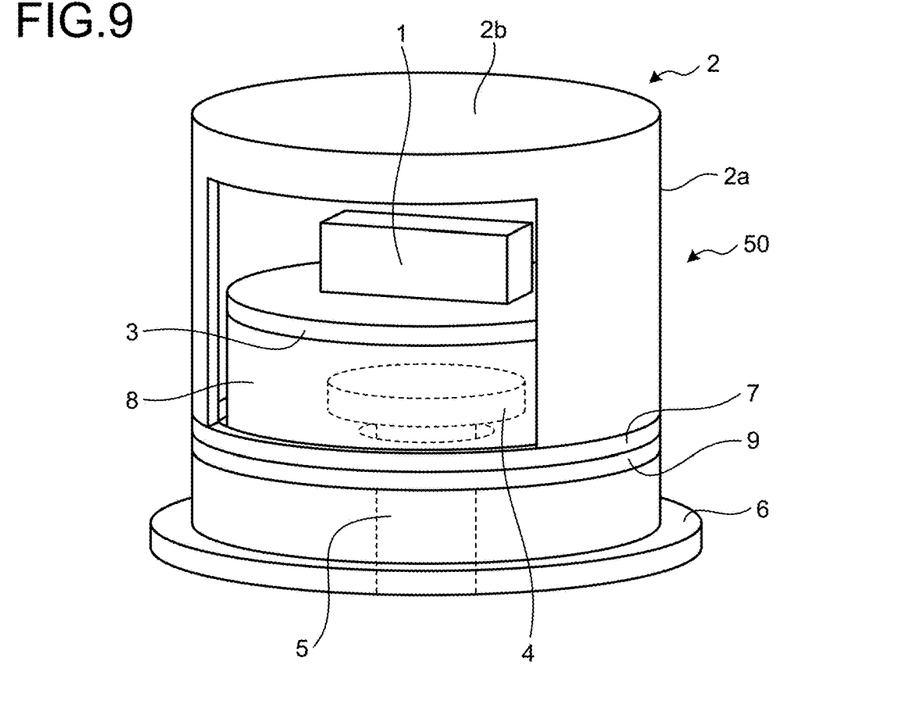
FIG. 9 is a perspective view of an encoder according to a third embodiment of the present invention.

FIG. 9 is a perspective view of an encoder according to a third embodiment of the present invention. The encoder 50 according to the third embodiment is different from the encoder 50 according to the first embodiment in that a magnetic shield plate 9 is located closer to the bracket 6 relative to the permanent magnet 4.

The spacer 7 is interposed between the magnetic shield plate 9 and the magnetic shield 2. Accordingly, a gap is formed between the bracket 6 and the magnetic shield 2, the gap having a thickness in which the thickness of the magnetic shield plate 9 and the thickness of the spacer 7 are added. The spacer 7 is interposed between the magnetic shield plate 9 and the magnetic shield 2, and thereby the magnetic shield plate 9 and the magnetic shield 2 are thermally separated from each other. Therefore, the bracket 6 and the magnetic shield 2 are also thermally separated from each other. A thermal gap is provided between the magnetic shield plate 9 and the magnetic shield 2 so that while thermal transmission from the shaft 5 is prevented or reduced during driving of the motor that rotates the shaft 5, a noise component included in the detection result of magnetic field detected by the magnetic sensor 1 can be reduced. Particularly, a distance between the bracket 6 and the magnetic shield 2 is set equal to or shorter than 5 mm. This setting can prevent a magnetic flux from entering the inner side of the magnetic shield 2, and thus can reduce a noise component included in the detection result of magnetic field detected by the magnetic sensor 1.

Even in a case where the encoder 50 according to the third embodiment is applied with an external magnetic field in the axial direction of the shaft 5, the encoder 50 can still reduce a noise component included in the detection result of magnetic field detected by the magnetic sensor 1.

Figure 10:
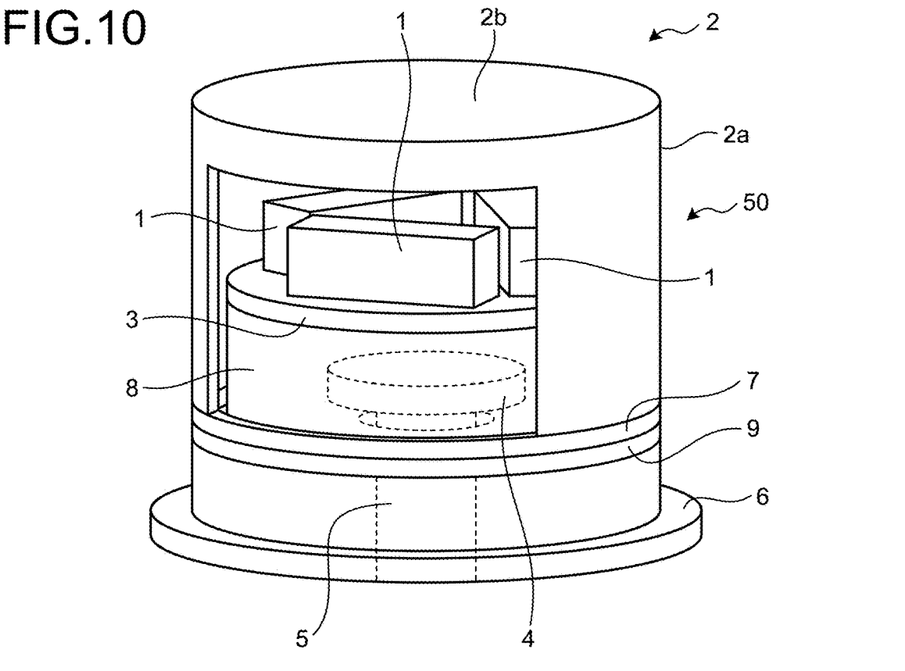
FIG. 10 is a perspective view of the encoder according to the third embodiment.

FIG. 10 is a perspective view of the encoder according to the third embodiment. It is also possible to employ such a configuration that the magnetic shield plate 9 is added to the encoder 50 according to the second embodiment, the encoder 50 having the plurality of the magnetic sensors 1 mounted on the encoder substrate 3. Similarly to the encoder 50 illustrated in FIG. 9, even in a case where the encoder 50 illustrated in FIG. 10 is applied with an external magnetic field in the axial direction of the shaft 5, this encoder 50 can still reduce a noise component included in the detection result of magnetic field detected by the magnetic sensor 1.

The configurations described in the above embodiments are only examples of the content of the present invention. The configurations can be combined with other well-known techniques, and part of each of the configurations can be omitted or modified without departing from the scope of the present invention.

REFERENCE SIGNS LIST 1 magnetic sensor, 2 magnetic shield, 2a side portion, 2b top-side portion, 3 encoder substrate, 4 permanent magnet, 5 shaft, 6 bracket, 7 spacer, 8 substrate holding member, 9 magnetic shield plate, 11 extended area, 21 notch, 21a opening plane, 50 encoder.

The invention claimed is:
1. An encoder comprising:
a magnetic sensor having directional detection sensitivity to a magnetic field, the magnetic sensor having higher detection sensitivity to a magnetic field applied in a reading direction, while having lower detection sensitivity to a magnetic field applied in a direction forming a greater angle with respect to the reading direction;
an encoder substrate having the magnetic sensor mounted thereon;
a magnetic shield to shield against the magnetic field, the magnetic shield including a side portion covering sides of the magnetic sensor and a top-side portion covering a top of the magnetic sensor;
a permanent magnet located to face the encoder substrate;
a shaft having the permanent magnet attached to a tip end of the shaft; and
a bracket to support the shaft in a rotatable manner, wherein
on the side portion of the magnetic shield, a notch or a hole is provided to serve as a connector insertion portion through which a connector is inserted,
the connector insertion portion is located at a position where the connector insertion portion does not overlap an extended area that is obtained by extending the magnetic sensor in the reading direction,
the connector insertion portion does not reach the top-side portion, and an opening width of the connector insertion portion is smaller than a dimension of the magnetic sensor in the reading direction.

2. The encoder according to claim 1, wherein a direction of a normal to an opening plane of the connector insertion portion is perpendicular to the reading direction.

3. The encoder according to claim 1, wherein
a plurality of the magnetic sensors are mounted on the encoder substrate, and
the connector insertion portion is located at a position where the connector insertion portion does not overlap an extended area that is obtained by extending one of the magnetic sensors in the reading direction, the one of the magnetic sensors being located nearest the connector insertion portion.

4. The encoder according to claim 3, wherein a direction of a normal to an opening plane of the connector insertion portion is perpendicular to the reading direction of the one of the magnetic sensors which is located nearest the connector insertion portion.

5. The encoder according to claim 4, wherein an opening width of the connector insertion portion is smaller than a dimension of, in the reading direction, the one of the magnetic sensors located nearest the connector insertion portion.

6. The encoder according to claim 3, wherein an opening width of the connector insertion portion is smaller than a dimension of, in the reading direction, the one of the magnetic sensors located nearest the connector insertion portion.

7. The encoder according to claim 1, wherein the encoder includes a magnetic shield plate to shield against the magnetic field, the magnetic shield plate being located closer to the bracket relative to the permanent magnet.

8. The encoder according to claim 1, wherein the magnetic shield and the bracket are thermally separated from each other.

9. An encoder comprising:
a magnetic sensor having directional detection sensitivity to a magnetic field, the magnetic sensor having higher detection sensitivity to a magnetic field applied in a reading direction, while having lower detection sensitivity to a magnetic field applied in a direction forming a greater angle with respect to the reading direction;
an encoder substrate having the magnetic sensor mounted thereon;
a magnetic shield to shield against the magnetic field, the magnetic shield including a side portion covering sides of the magnetic sensor and a top-side portion covering a top of the magnetic sensor;
a permanent magnet located to face the encoder substrate;
a shaft having the permanent magnet attached to a tip end of the shaft; and
a bracket to support the shaft in a rotatable manner, wherein
on the side portion of the magnetic shield, a notch or a hole is provided to serve as a connector insertion portion through which a connector is inserted,
the connector insertion portion is located at a position where the connector insertion portion does not overlap an extended area that is obtained by extending the magnetic sensor in the reading direction, wherein
an opening width of the connector insertion portion is smaller than a dimension of the magnetic sensor in the reading direction.

10. The encoder according to claim 9, wherein a direction of a normal to an opening plane of the connector insertion portion is perpendicular to the reading direction.

11. The encoder according to claim 9, wherein
a plurality of the magnetic sensors are mounted on the encoder substrate, and
the connector insertion portion is located at a position where the connector insertion portion does not overlap an extended area that is obtained by extending one of the magnetic sensors in the reading direction, the one of the magnetic sensors being located nearest the connector insertion portion.

12. The encoder according to claim 11, wherein a direction of a normal to an opening plane of the connector insertion portion is perpendicular to the reading direction of the one of the magnetic sensors which is located nearest the connector insertion portion.

13. The encoder according to claim 12, wherein an opening width of the connector insertion portion is smaller than a dimension of, in the reading direction, the one of the magnetic sensors located nearest the connector insertion portion.

14. The encoder according to claim 11, wherein an opening width of the connector insertion portion is smaller than a dimension of, in the reading direction, the one of the magnetic sensors located nearest the connector insertion portion.

15. The encoder according to claim 9, wherein the encoder includes a magnetic shield plate to shield against the magnetic field, the magnetic shield plate being located closer to the bracket relative to the permanent magnet.

16. The encoder according to claim 9, wherein the magnetic shield and the bracket are thermally separated from each other.

* * * * *